(12) United States Patent
Shah et al.

(10) Patent No.: US 8,914,155 B1
(45) Date of Patent: Dec. 16, 2014

(54) CONTROLLING FLUID FLOW IN A DATA CENTER

(75) Inventors: Amip J. Shah, Santa Clara, CA (US);
Cullen E. Bash, Los Gatos, CA (US);
Zhikui Wang, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 295 days.

(21) Appl. No.: 12/914,600

(22) Filed: Oct. 28, 2010

(51) Int. Cl.
*H05K 7/20* (2006.01)

(52) U.S. Cl.
USPC ............. 700/282; 700/300; 700/19; 700/299; 700/277; 700/278

(58) Field of Classification Search
None
See application file for complete search history.

(56) References Cited

U.S. PATENT DOCUMENTS

| | | | |
|---|---|---|---|
| 5,951,394 A * | 9/1999 | Pariseau | 454/61 |
| 6,034,873 A * | 3/2000 | Ståhl et al. | 361/701 |
| 6,374,627 B1 * | 4/2002 | Schumacher et al. | 62/259.2 |
| 6,574,104 B2 * | 6/2003 | Patel et al. | 361/695 |
| 6,694,759 B1 * | 2/2004 | Bash et al. | 62/180 |
| 6,868,682 B2 * | 3/2005 | Sharma et al. | 62/180 |
| 6,945,058 B2 * | 9/2005 | Bash et al. | 62/89 |
| 7,031,870 B2 * | 4/2006 | Sharma et al. | 702/130 |
| 7,214,131 B2 | 5/2007 | Malone | |
| 7,251,547 B2 * | 7/2007 | Bash et al. | 700/276 |
| 7,313,924 B2 * | 1/2008 | Bash et al. | 62/178 |
| 7,347,058 B2 * | 3/2008 | Malone et al. | 62/259.2 |
| 7,403,391 B2 | 7/2008 | Germagian et al. | |
| 7,430,118 B1 * | 9/2008 | Noteboom et al. | 361/695 |
| 7,447,022 B2 * | 11/2008 | Murakami et al. | 361/695 |
| 7,630,198 B2 | 12/2009 | Doll | |
| 7,630,795 B2 * | 12/2009 | Campbell et al. | 700/300 |
| 7,672,128 B2 * | 3/2010 | Noteboom et al. | 361/696 |
| 7,682,234 B1 * | 3/2010 | Beitelmal et al. | 454/256 |
| 7,885,795 B2 * | 2/2011 | Rasmussen et al. | 703/5 |
| 7,957,142 B2 * | 6/2011 | Noteboom et al. | 361/696 |
| 7,991,592 B2 * | 8/2011 | VanGilder et al. | 703/1 |
| 7,992,402 B2 * | 8/2011 | VanGilder et al. | 62/259.2 |
| 7,995,339 B2 * | 8/2011 | Bash et al. | 361/692 |
| 8,009,430 B2 * | 8/2011 | Claassen et al. | 361/724 |
| 8,156,753 B2 * | 4/2012 | VanGilder et al. | 62/259.2 |
| 8,184,435 B2 * | 5/2012 | Bean et al. | 361/696 |
| 8,203,837 B2 * | 6/2012 | Zeighami et al. | 361/679.46 |
| 8,218,322 B2 * | 7/2012 | Clidaras et al. | 361/701 |

(Continued)

FOREIGN PATENT DOCUMENTS

| | | |
|---|---|---|
| DE | 10304837 | 8/2004 |
| WO | 2009059796 | 5/2009 |

OTHER PUBLICATIONS

Wang et al., "Integrated Management of Cooling Resources in Air-cooled Data Centers," 6th Annual IEEE Conference on Automation Science and Engineering, Aug. 21-24, 2010, Toronto, Ontario, Canada (6 pages).

*Primary Examiner* — Kavita Padmanabhan
*Assistant Examiner* — Christopher E Everett

(57) ABSTRACT

Methods, apparatus, systems and articles of manufacture to control fluid flow in a data center are disclosed herein. An example method disclosed herein comprises sensing a condition of a fluid in a first contained aisle on a first side of data center equipment, the fluid in the first contained aisle substantially isolated from a second contained aisle on a second side of the data center equipment, and controlling a vent to alter the fluid flow between the first contained aisle and the second contained aisle based on the sensed condition.

17 Claims, 4 Drawing Sheets

(56) References Cited

U.S. PATENT DOCUMENTS

| | | | |
|---|---|---|---|
| 8,249,825 B2* | 8/2012 | VanGilder et al. | 702/182 |
| 8,320,128 B2* | 11/2012 | Wei | 361/695 |
| 2005/0111184 A1* | 5/2005 | Cliff et al. | 361/688 |
| 2005/0170770 A1* | 8/2005 | Johnson et al. | 454/184 |
| 2006/0139877 A1* | 6/2006 | Germagian et al. | 361/695 |
| 2006/0260338 A1* | 11/2006 | VanGilder et al. | 62/259.2 |
| 2007/0197159 A1* | 8/2007 | Byczynski et al. | 454/340 |
| 2009/0007978 A1 | 1/2009 | Alston et al. | |
| 2009/0326721 A1* | 12/2009 | Sugiyama et al. | 700/282 |
| 2010/0057258 A1* | 3/2010 | Clanin | 700/276 |
| 2010/0186517 A1* | 7/2010 | Bean, Jr. | 73/726 |
| 2010/0263830 A1* | 10/2010 | Noteboom et al. | 165/80.2 |
| 2012/0067136 A1* | 3/2012 | Bean et al. | 73/861.75 |

* cited by examiner

CONTROLLING FLUID FLOW IN A DATA CENTER

BACKGROUND

Data centers often include aisles which are separated or isolated to achieve desired environmental conditions. For example, an aisle in which computing devices exhaust heat may be separated by walls, seals, or the like from an aisle from which the computing devices take in cooled air. Aisles that are separated from one another to substantially isolate their environmental conditions are referred to as "contained aisles." Data centers utilize contained aisles to prevent hot air exhausted by data center computing equipment from recirculating with cooled air applied to the intake side of the equipment. Prior techniques for achieving desired environmental conditions (such as temperature, pressure, etc.) in a contained aisle include adjusting an operation (such as fan speed, output temperature, etc.) of a cooling unit supplying the cooled air to the intake side of the equipment. Adaptive vent tiles employing remotely controllable dampers have also been used in the supply plenum (e.g., located in the floor of the contained aisle) to vary an amount of cooled air provided to the intake side of the equipment.

DETAILED DESCRIPTION

Figure 1:
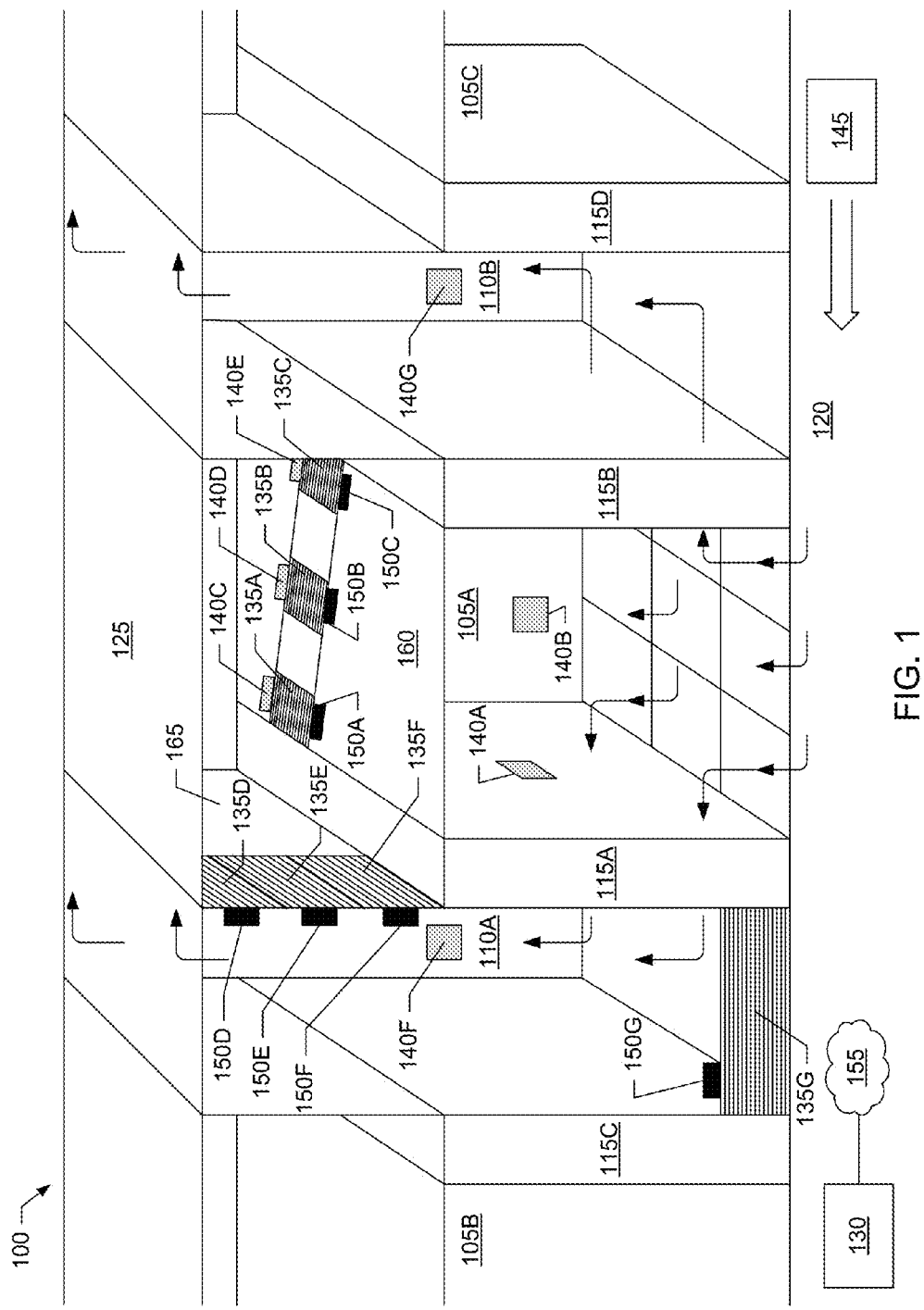
FIG. 1 is block diagram of an example data center employing an example environmental control system including an example environmental controller and example adaptive vent tiles to control fluid flow in contained aisles as described herein.

Methods, apparatus, systems and articles of manufacture to control flow in contained aisles are disclosed herein. As described above, prior environmental control systems for contained aisles operate by adjusting the supply of cooling fluid (such as cooled air or other cooled gaseous medium, cooled water, etc.) provided to the cold contained aisles. For example, such prior systems adjust the operation (such as fan speed, output temperature, etc.) of one or more cooling sources supplying the cooling fluid to a cold contained aisle, or adjusting one or more adaptive vent tiles to permit or restrict the fluid flow in one or more supply plenums supplying the cooling fluid to the cold contained aisle. However, such techniques are limited to adjusting the cooling fluid supplied to the cold contained aisle and, thus, can yield operating inefficiencies. For example, adjusting the cooling fluid supplied to contained aisles can cause pressure gradients at the inlet side of the equipment racks that can prevent equipment fans from drawing in sufficient air, thereby causing the equipment to overheat. Example methods, apparatus, systems and articles of manufacture disclosed herein can improve these operating efficiencies and compensate for these pressure gradients by providing control mechanisms for controlling flow in and between contained aisles.

Example environmental control systems disclosed herein that can be beneficial over the aforementioned prior environmental control systems employ one or more adaptive vent tiles (or, more generally, adaptive vents) positioned to achieve desired environmental conditions by altering fluid flow (such as airflow) between cold and hot contained aisles on different sides of data center equipment without, or in addition to, adjusting operation of the cooling sources(s) (or, more generally, flow source(s)) and/or adaptive vent tile(s) supplying the cooling fluid to the cold containment aisle. In some examples, a cold contained aisle is a contained aisle maintained at or below a given temperature, whereas a hot contained aisle is a contained aisle that is maintained at or above, or allowed to exceed, a given temperature. Example environmental control systems also include one or more sensors positioned to measure one or more conditions of the cooling fluid in the cold contained aisle (e.g., and possibly one or more environmental conditions in the adjacent hot contained aisle(s)), and an environmental controller to control the adaptive vent tile(s) (e.g., positioned between the cold and hot containment aisles) based on the measurements received from the sensor(s) and one or more target environmental conditions specified for the cold contained aisle. In some example environmental control systems disclosed herein, the environmental controller can also control operation of one or more cooling sources (e.g., air conditioners, air movers, etc.) supplying the cooling fluid to the cold containment aisle. Operating efficiency of the cooling source(s) may be improved when control of the adaptive vent tile(s) can achieve the target environmental condition(s) because, for example, it may be possible to run the cooling source(s) less frequently, at lower power level(s), etc.

For example, based on a sensed pressure in the cold contained aisle on the intake side of the data center equipment, one or more adaptive vent tiles positioned to separate the cold contained aisle from the hot contained aisle on the exhaust side of the equipment can be remotely adjusted to permit the hot air from the hot contained aisle to supplement the cold air in the contained aisle to increase the pressure on the intake side of the equipment, so long as the resulting increase in temperature does not cause a temperature threshold for the cold contained aisle to be exceeded. By using the hot air from the hot contained aisle to increase the pressure in the cold contained aisle when there is sufficient temperature margin (i.e., when the temperature of the cold aisle will not be driven above the threshold), the output airflow of the cooling sources(s) can be reduced, thereby potentially improving the operating efficiency of the cooling source(s).

Turning to the figures, FIG. 1 is a block diagram of an example data center 100 employing an example environmental control system as described herein. The data center 100 includes example cold contained aisles 105A-C separated by example hot contained aisles 110A-B. Generally, a cold contained aisle, such as the example cold contained aisle 105A, is formed on the intake (e.g., the front) sides of racks of data center equipment, such as the example racks of data center equipment 115A-B. The racks 115A-B of the illustrated example are arranged to form the sides of the cold contained aisle 105A. The cold contained aisle 105A of the illustrated example is enclosed (e.g., via a floor, a ceiling, walls, etc.) to substantially contain a cooling fluid (also referred to as a cooling medium, such as cooled air, a cooled gaseous medium, cooled water, cooled liquid, etc.) within the cold contained aisle and to substantially isolate the cooling fluid from areas outside the cold contained aisle, such as the adjacent hot contained aisles (e.g., the hot contained aisles 110A-B) formed on the opposite sides of the racks of data center equipment 115A-B.

Using the cold contained aisles 105A as an example, and without loss of generality, the cold contained aisle 105A is considered to substantially contain, or isolate, the cooling fluid within the aisle 105A. In particular, the cooling fluid supplied via an example supply plenum or duct 120 is substantially prevented from leaving the contained aisle 105A, except for fluid flow that is drawing through the intakes of the data center equipment 115A-B and emitted as exhaust into the hot contained aisles 110A-B. Fluid exhausted into the hot contained aisles 110A-B may be returned via a return plenum or duct 125 after having been drawn into and passed through the racks of data center equipment 115A-B (e.g., as illustrated by the directed arrows in FIG. 1). In the illustrated example, fluid flow is also permitted to exit the cold contained aisle 105A via one or more adaptive vent tiles 135A-G (also referred to as adaptive vents), as described in greater detail below. Additionally, the cold contained aisle 105A of the illustrated example is considered to substantially contain, or isolate, the cooling fluid within the aisle because external fluid from outside areas, such as the hot contained aisles 110A-B, is prevented from recirculating into the cold contained aisle 105A, except via one or more adaptive vent tiles 135A-G, as described in greater detail below. Substantially containing, or isolating, the cooling fluid within the cold contained aisle 105A in this manner enables the supplied cooling fluid to be used efficiently to maintain target environmental conditions (e.g., temperature, pressure, flow, etc.) under which the racks of data center equipment 115A-B are to be operated.

In some examples, the cold contained aisle 105A and one or both of the hot contained aisles 110A-B can be in fluid communication via air mover(s) (not shown) placed above the racks 115A-B between the cold contained aisle 105A and one or both of the hot contained aisles 110A-B. Heat exchangers (not shown) are placed adjacent to the air mover(s) to remove heat from the hot contained aisle(s) 110A and/or 110B before pressurizing the cold contained aisle 105A. One or more adaptive vent tiles (not shown) can be placed in these fluid pathways (e.g., upstream or downstream of the air mover(s) and heat exchanger(s)) to regulate fluid flow between the cold contained aisle 105A and the hot contained aisle(s) 110A and/or 110B, as described in greater detail below.

The example environmental control system employed by the data center 100 to control flow in the contained aisles 105A-C and 110A-B to maintain target environmental conditions includes an example environmental controller 130, one or more example adaptive vent tiles 135A-G, one or more example sensors 140A-G and one or more example flow sources 145. The adaptive vent tiles 135A-G include respective example actuators 150A-G (e.g., motors, pistons, etc.) that enable remote control of the adaptive vent tiles 135A-G. For example, the environmental controller 130 can control, based on sensor measurements received from one or more of the sensors 140A-G, one or more of the actuators 150A-G to remotely adjust the openings of one or more of the adaptive vent tiles 135A-G to alter (e.g., increase or decrease) the fluid flow permitted through the adaptive vent tiles 135A-G and, thus, between the cold contained aisles 105A-C and adjacent hot contained aisles 110A-B, and/or from the hot contained aisles 110A-B to outside areas, etc.

In the illustrated example, the environmental control system includes an example network 155 to connect the environmental controller 130 with the sensor(s) 140A-G, the adaptive vent tile(s) 135A-G and the flow source(s) 145. In some examples, the network 155 is implemented by one or more data communication networks (e.g., such as any type of wired or wireless data communication network) employing one or more communication protocols supported by the environmental controller 130, the sensor(s) 140A-G, the adaptive vent tile(s) 135A-G and the flow source(s) 145. In some examples, the network 155 is implemented by cabled connections, wireless (e.g., radio frequency, infrared, optical, etc.) connections, or both, between the environmental controller 130 and one or more of the sensor(s) 140A-G, the adaptive vent tile(s) 135A-G and the flow source(s) 145. In some examples, the network 155 is implemented by a combination of one or more data communication networks and one or more direct connections.

In the illustrated example, the environmental controller 130 controls the adaptive vent tile(s) 135A-G and the flow source(s) 145 to achieve one or more target environmental conditions in the cold contained aisles 105A-C. For example, the target environmental conditions can be one or more of a fluid flow rate, a fluid temperature, a pressure of the cooling fluid, etc. at one or more locations, such as at the inlets and/or particular sides of the racks of data center equipment 115A-B. Additionally or alternatively, a target environmental condition may indirectly correspond to a target operating condition specified for the data center equipment 115A-B. For example, the target operating condition may correspond to temperatures of one or more devices or servers included in the data center equipment 115A-B. Furthermore, the target temperature for the data center equipment 115A-B could be specified in any desired manner (e.g., as internal temperatures, external case temperatures, etc. Thus, the environmental controller 130 can control flow in the contained aisles 105A-C and 110A-B to achieve the target operating condition(s) of the data center equipment 115A-B and/or to achieve the target environmental conditions in the cold contained aisles 105A-C. The target environmental condition(s) and/or target operating condition(s) can be specified as inputs to the environmental controller 130, preconfigured, hardcoded, etc., or any combination thereof.

In the illustrated example, to determine whether the target environmental condition(s) have been achieved in the cold contained aisles 105A-C, the environmental controller 130 of the illustrated example receives measurements sensed by the sensors 140A-G. The sensors 140A-G can be positioned in a number of different locations, as shown in FIG. 1. In some examples, the sensors 140A-G are positioned at or near the locations of the specified the target environmental conditions and/or target operating conditions. For example, using the cold contained aisle 105A as an example, and without loss of generality, one or more of the sensors 140A-G can be mounted at the inlets and/or particular sides of the racks of data center equipment 115A-B (such as the sensor 140A) to measure, for instance, temperature, pressure, etc. Additionally or alternatively, one or more of the sensors 140A-G can be placed at other locations in the cold contained aisle 105A (such as the sensor 140B) to measure, for instance, temperature, pressure, etc. Additionally or alternatively, one or more of the sensors 140A-G can be co-located (e.g., integrated) with one or more of the adaptive vent tile(s) 135A-G (such as the sensors 140C-E that are associated with the adaptive vent tile 135A-C), thereby supporting sensing of environmental condition(s) upstream and/or downstream of these adaptive vent tile(s). Additionally or alternatively, one or more of the sensors 140A-G can be placed in the adjacent hot contained aisles 110A-B (such as the sensors 140E-G), in the supply (e.g., underfloor) plenum 120, in the return (e.g., ceiling) plenum 125, or in any other desired location to monitor the state of any environmental condition (e.g., temperature, pressure, humidity, flow rate, etc). In some examples, the sensors 140A-G sense environmental conditions, such as fluid flow rate, temperature, pressure, etc. In some examples, the sensors 140A-G additionally or alternatively sense equipment operating conditions, such as case and/or internal operating temperatures, etc., of the data center equipment 115A-B. As such, one or more of the sensors 140A-G may be linked or otherwise in communication with data center equipment 115A-B and/or other components in the data center 100. For example, one or more of the sensors 140A-G could be attached to or located in the data center equipment 115A-B to measure, for example, processor temperatures, disk drive temperatures, external case temperatures, etc.

In the illustrated example, the environmental controller 130 receives the measurements from the sensors 140A-G via the network 155. Based on the received measurements and the target environmental condition(s), the environmental controller 130 determines whether to control (e.g., remotely and automatically) one or more of the adaptive vent tiles 135A-G to achieve the target environmental condition(s). In some examples, the environmental controller 130 can additionally control the flow source(s) 145 based on the received measurements, the target environmental condition(s) and, for example, whether adjustment of the one or more of the adaptive vent tiles 135A-G successfully achieved the target environmental condition(s). In the illustrated example, the environmental controller 130 sends control commands and/or otherwise effects control of the adaptive vent tiles 135A-G and the flow source(s) 145 via the network 155. Example flow control processing performed by the environmental controller 130 is described in greater detail below.

As illustrated in the example of FIG. 1, the adaptive vent tiles 135A-G can be placed in various locations to enable the environmental controller 130 to flexibly control fluid flow between the cold contained aisles 105A-C and adjacent hot contained aisles 110A-B, into the cold contained aisles 105A-C, out of the hot contained aisles 110A-B, etc. For example, in the data center 100 of FIG. 1, adaptive vent tiles 135A-C are placed in the ceiling 160 of the cold contained aisle 105A, adaptive vent tiles 135D-F are placed in the wall 165 separating the cold contained aisle 105A and the hot contained aisle 110A, and an adaptive vent tile 135G is placed in the front wall of the hot contained aisle 110A. In the illustrated example, by opening one or more of the adaptive vent tiles 135A-C without opening the adaptive vent tiles 135D-F, the environmental controller 130 can cause cooling fluid to flow out of the cold contained aisle 105A to, for example, decrease pressure in the cold contained aisle 105A. However, if the environmental controller 130 also opens one or more of the adaptive vent tiles 135D-F, and the pressure in the hot contained aisle 110A is higher than the pressure in the cold contained aisle 105A, then fluid can flow from the hot contained aisle 110A into the cold contained aisle 105A to, for example, increase pressure in the cold contained aisle 105A. The environmental controller 130 can also open the adaptive vent tile 135G to permit fluid to flow out of or into the hot contained aisle 110A. Further examples of adaptive vent control are described in greater detail below.

Figure 2:
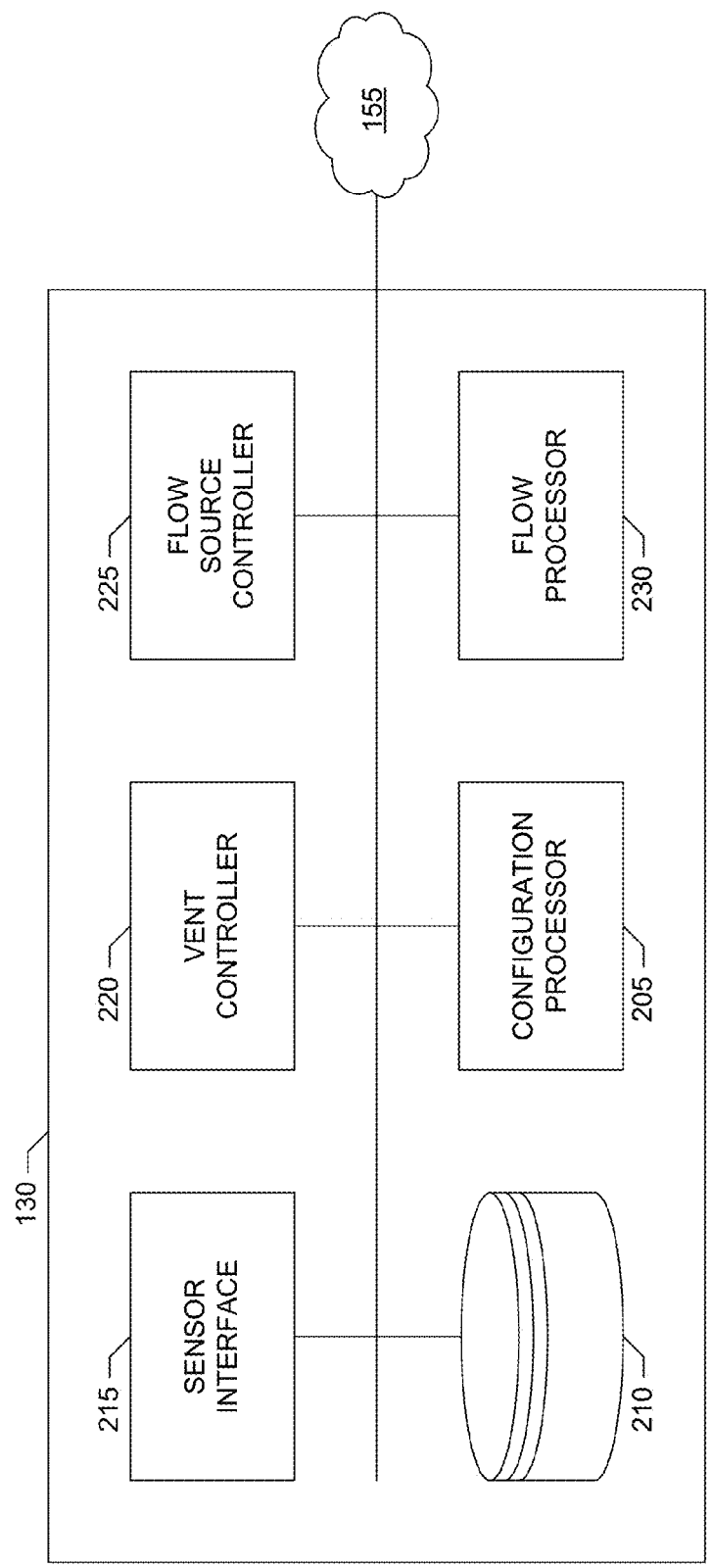
FIG. 2 is a block diagram of an example implementation of the environmental controller of FIG. 1.

A block diagram of an example implementation of the environmental controller 130 of FIG. 1 is illustrated in FIG. 2. The example environmental controller 130 of FIG. 2 includes an example configuration processor 205 to configure the target environmental condition(s) described above to be achieved by the flow control processing performed by the environmental controller 130. For example, the configuration processor 205 can interface with a user terminal, such as a computer, personal digital assistant (PDA), smartphone, etc., or any other input device, connected to the network 155 or directly to the environmental controller 130 to receive input target environmental conditions (e.g., fluid flow rate, fluid temperature, fluid pressure, etc.) specified for one or more locations in the cold contained aisles 105A-C of the data center 100. The configuration processor 205 then stores the input target environmental conditions in an example data storage 210. The data storage 210 can be implemented using any type of memory or storage device, or combination thereof, such as the example volatile memory 418 and/or the example mass storage device 430 of the example processing system 400, which is described in greater detail below. In some examples, one or more of the target environmental conditions may additionally or alternatively be preconfigured (e.g., as default target environmental conditions) and stored in the data storage 210 which, in some examples, may be overwritten via user input.

In some examples, the configuration processor 205 also receives one or more control parameters for configuring the flow control processing performed by the configuration processor 205. For example, the configuration processor 205 may be used to specify whether flow control processing is to control the adaptive vent tiles 135A-G (and possibly the flow source(s) 145) to achieve the target environmental conditions, or to reduce (e.g., minimize) a cost function (e.g., related to energy consumption, cooling efficiency, etc.) having parameters set by the target environmental conditions, etc. In such examples, the configuration processor 205 can store the control parameter(s) in the data storage 210.

The environmental controller 130 of FIG. 2 also includes an example sensor interface 215 to receive measurements from the sensors 140A-G via the network 155. In some examples, the sensor interface 215 repeatedly polls (e.g., queries) the sensors 140A-G at a polling interval and in a polling order to receive current and/or stored measurements from the sensors 140A-G. In some examples, the sensor interface 215 additionally or alternatively can be interrupted to receive measurements transmitted by the sensors 140A-G (e.g., autonomously without polling). The sensor interface 215 then stores the received measurements in the data storage 210 for use in the flow control processing performed by the environmental controller 130.

The environmental controller 130 of FIG. 2 further includes an example vent controller 220 to control the adaptive vent tiles 135A-G included in the data center 100. For a particular adaptive vent tile, such as the adaptive vent tile 135A, the vent controller 220 can be configured to remotely command (e.g., via the network 155) the actuator 150A associated with the adaptive vent tile 135A to adjust the adaptive vent tile 135A to a fully closed position, a fully open position, or one or more intermediate positions (e.g., if the adaptive vent tile 135A supports such intermediate positions). Additionally or alternatively, the actuator 150A can cause a characteristic, such as an orientation, shape, size, etc., of the, of the adaptive vent tile 135A to change to alter the fluid flow permitted through the adaptive vent tile 135A. In some examples, the vent controller 220 can be configured to control one or more of the adaptive vent tiles 135A-G independently. For example, the vent controller 220 can be configured to independently control a first adaptive vent (not shown) to allow fluid flow between the cold contained aisle 105A and the hot contained aisle 110B, and to independently control a second adaptive vent (not shown) to allow fluid flow between the cold contained aisle 105C and the hot contained aisle 110B or another hot contained aisle (not shown) on the opposite side of the cold contained aisle 105C. Additionally or alternatively, the controller 220 can be configured to collectively control a group of the adaptive vent tiles 135A-G (e.g., by adjusting the group of vent tiles in unison). For example, the vent controller 220 can be configured to control in unison some or all of the adaptive vent tiles 135A-C located in the ceiling 160 of the cold contained aisle 105A (e.g., to simplify control of co-located adaptive vent tiles). Additionally or alternatively, the controller 220 can be configured to collectively control multiple groups of the adaptive vent tiles 135A-G (e.g., in unison). For example, the vent controller 220 can be configured to control a first group of one or more of the adaptive vent tiles 135A-C and a second group of one of the adaptive vent tiles 135D-F located in the wall 165 separating the cold contained aisle 105A and the hot contained aisle 110A such that both groups are adjusted in unison (e.g., to simplify control of multiple adaptive vent tiles that together achieve a desired fluid flow).

In some examples, the environmental controller 130 of FIG. 2 includes an example flow source controller 225 to remotely control (e.g., via the network 155) the flow source(s) 145 for the data center 100. Example flow sources 145 capable of being controlled by the flow source controller 225 include, but are not limited to, computer room air conditioner (CRACs), air movers, chilled water supplies, etc., or any other type of heating, ventilating and air conditioning (HVAC) source, or combination thereof. As such, remote control of such flow sources can include, for example, sending control commands, asserting control signals, etc., to control one or more variable frequency drives driving one or more fans/blowers, to control one or more water valves, to control one or more adaptive vent tiles in the supply plenum(s), etc., or any combination thereof.

Additionally, in some examples the flow source controller 225 can control which of several power sources supply the flow sources 145 cooling the data center 145. For example, the flow source controller 225 could select which of several power sources is to supply the flow sources to reduce power consumption costs during peak or off-peak hours to improve the environmental footprint of data center 100 when, for example, the target environmental condition(s) can be achieved by controlling only the adaptive vent tiles 135A-G. Furthermore, in some examples the flow source controller 225 can control other devices that manipulate the flow supplied by the flow sources 145. For example, the flow source controller 225 could control one or more fans within the data center equipment 115A-B to increase or decrease flow rate of the cooling fluid pulled into the data center equipment 115A-B. Additionally or alternatively, the flow source controller 225 could reduce processing rates of the data center equipment 115A-B to reduce the heat generated by the data center equipment 115A-B and which is to be dissipated by the supplied cooling fluid.

To implement flow control processing, the environmental controller 130 of FIG. 2 includes an example flow processor 230. For example, the flow processor 230 retrieves the target environmental condition(s) and the sensor measurement(s) stored in the data storage 210. Then, based on the target environmental condition(s) and the sensor measurement(s), the flow processor 230 implements a control process to determine what, if any, control of the adaptive vent tiles 135A-G should be performed by the vent controller 220, and what, if any, control of the flow source(s) 145 should be performed by the flow source controller 225. For example, the flow processor 230 can compare sensor measurement(s) to the target environmental condition(s) (and/or the target operating condition(s) described above) to determine whether the target environmental condition(s) have already been achieved in the cold contained aisles 105A-C of the data center 100. If the target environmental condition(s) have not been achieved, the flow source controller 225 can determine appropriate adjustment(s) of one of more of the adaptive vent tiles 135A-G that is(are) likely to achieve the target environmental condition(s). The appropriate adjustment(s) of the adaptive vent tile(s) 135A-G as determined by flow source controller 225 can include, for example, indications of which of the adaptive vent tiles 135A-G are to be controlled and the type of control to be applied, such as an amount by which these adaptive vent tiles 135A-G are to be opened or closed relative to their respective current positions.

For example, if the flow source controller 225 determines from the sensor measurement(s) returned by the sensor 140A that a measured pressure of the cooling fluid at the inlet side of the data center equipment 115A in the contained aisle 105A is below a target pressure, and the sensor 140B indicates that a measured temperature of the cooling fluid in the contained aisle 105A is below a target temperature (e.g., with excess margin such that the temperature in the contained aisle 105A can be increased and still remain below the target temperature), then the flow source controller 225 can determine that the adaptive vent tiles 135A-C and 135D-F should be opened to increase the pressure in the contained aisle 105A by permitting fluid flow from the hot contained aisle 110A to the cold contained aisle 105A. Conversely, if the flow source controller 225 determines from the sensor measurement(s) returned by the sensor 140A that the measured pressure of the cooling fluid at the inlet side of the data center equipment 115A in the contained aisle 105A is above the target pressure, then the flow source controller 225 can determine that the adaptive vent tiles 135A-C and 135D-F should be closed to decrease the pressure in the contained aisle 105A by restricting or preventing fluid flow from the hot contained aisle 110A to the cold contained aisle 105A. In some examples, the flow source controller 225 can determine which of the adaptive vent tiles 135A-C and 135D-F should be opened or closed, and by how much, based on the pressure differential between the cold contained aisle 105A and the hot contained aisle 110A, and the difference between the target and measured pressure in the cold contained aisle 105A. Additionally, different adaptive vent control can be applied to different cold contained aisles 105A-C and hot contained aisles 110A-B if the sensor measurement(s) and/or target condition(s) differ among these contained aisles.

After the vent controller 220 controls one or more of the adaptive vent tiles 135A-G as determined by the flow processor 230, the flow processor 230 retrieves new sensor measurement(s) from the data storage 210. For example, the sensor measurement(s) may be collected a sufficient time after the adjustment of the adaptive vent tiles for a change in the monitored environmental condition(s) to be detected. If the sensor measurements indicate that the target environmental condition(s) have been achieved (e.g., with or without previous adjustment of the adaptive vent tiles 135A-G), then the flow processor 230 indicates that no further control of the adaptive vent tiles 135A-G is needed at the present time. Additionally, in some examples, the flow processor 230 can determine appropriate adjustment(s) of one or more of the flow source(s) 145 to improve operating efficiency of the flow source(s) 145. The appropriate adjustment(s) determined by flow source controller 225 to improve operating efficiency of the flow source(s) 145 can include, for example, indications that fan/blower speed can be reduced to decrease flow rate and/or pressure of the output flow of one or more of the flow sources 145, indications that a temperature of the output flow of one or more of the flow sources 145 can be increased and, thus, chilled water valve(s) can be closed (thereby using less energy as less water is to be chilled), etc., or any combination thereof. In some examples, the flow control processing performed by the flow processor 230 is iterative, thereby allowing further control of the adaptive vent tiles 135A-G to be used to enable further control of the flow source(s) 145 to further improve operating efficiency of the flow source(s) 145.

If, however, the sensor measurements indicate that the target environmental condition(s) have not been achieved after control of the adaptive vent tiles 135A-G, or if the flow processor 230 determines that no control of the adaptive vent tiles 135A-G can achieve the target environmental condition(s), then the flow processor 230 can determine appropriate adjustment(s) of one or more of the flow source(s) 145 to achieve the target environmental condition(s). The appropriate adjustment(s) determined by flow source controller 225 to achieve the target environmental condition(s) can include, for example, indications that fan/blower speed should be increased to increase flow rate and/or pressure of the output flow of one or more of the flow source(s) 145, indications that a temperature of the output flow of one or more of the flow source(s) 145 should be decreased and, thus, chilled water valve(s) should be opened, etc., or any combination thereof.

For example, if the flow source controller 225 determines from the sensor measurement(s) returned by the sensor 140A that a measured pressure of the cooling fluid at the inlet side of the data center equipment 115A in the contained aisle 105A is still below the target pressure, and the sensor 140B indicates that a measured temperature of the cooling fluid in the contained aisle 105A is above the target temperature (e.g., because the adaptive vent tiles 135A-E have been opened), then the flow source controller 225 can determine that the flow rate and/or the pressure of the output flow of one or more of the flow source(s) 145 should be increased, and/or a temperature of the output flow of one or more of the flow source(s) 145 should be decreased, to achieve the target environmental condition(s). In some examples, the flow source controller 225 can determine which of the flow source(s) 145 should be adjusted, and by how much, based on the difference between the target and measured pressure in the cold contained aisle 105A and the different between the target and measured temperature in the cold contained aisle 105A. Additionally, different flow source control can be applied to different flow source(s) 145 if, for example, different flow source(s) 145 supply different ones or groups of the cold contained aisles 105A-C.

While an example manner of implementing the environmental controller 130 of FIG. 1 has been illustrated in FIG. 2, one or more of the elements, processes and/or devices illustrated in FIG. 2 may be combined, divided, re-arranged, omitted, eliminated and/or implemented in any other way. Further, the example configuration processor 205, the example data storage 210, the example sensor interface 215, the example vent controller 220, the example flow source controller 225, the example flow processor 230 and/or, more generally, the example environmental controller 130 of FIG. 2 may be implemented by hardware, machine readable instructions (including software and firmware) and/or any combination of hardware and/or machine readable instructions. Thus, for example, any of the example configuration processor 205, the example data storage 210, the example sensor interface 215, the example vent controller 220, the example flow source controller 225, the example flow processor 230 and/or, more generally, the example environmental controller 130 could be implemented by one or more circuit(s), programmable processor(s), application specific integrated circuit(s) (ASIC(s)), programmable logic device(s) (PLD(s)) and/or field programmable logic device(s) (FPLD(s)), etc. When any of the appended apparatus claims are read to cover an implementation purely by machine readable instructions, at least one of the example environmental controller 130, the example configuration processor 205, the example data storage 210, the example sensor interface 215, the example vent controller 220, the example flow source controller 225 and/or the example flow processor 230 are hereby expressly defined to include a tangible computer readable medium such as a memory, digital versatile disk (DVD), compact disk (CD), etc., storing such machine readable instructions. Further still, the example environmental controller 130 of FIG. 2 may include one or more elements, processes and/or devices in addition to, or instead of, those illustrated in FIG. 2, and/or may include more than one of any or all of the illustrated elements, processes and devices.

Figure 3:
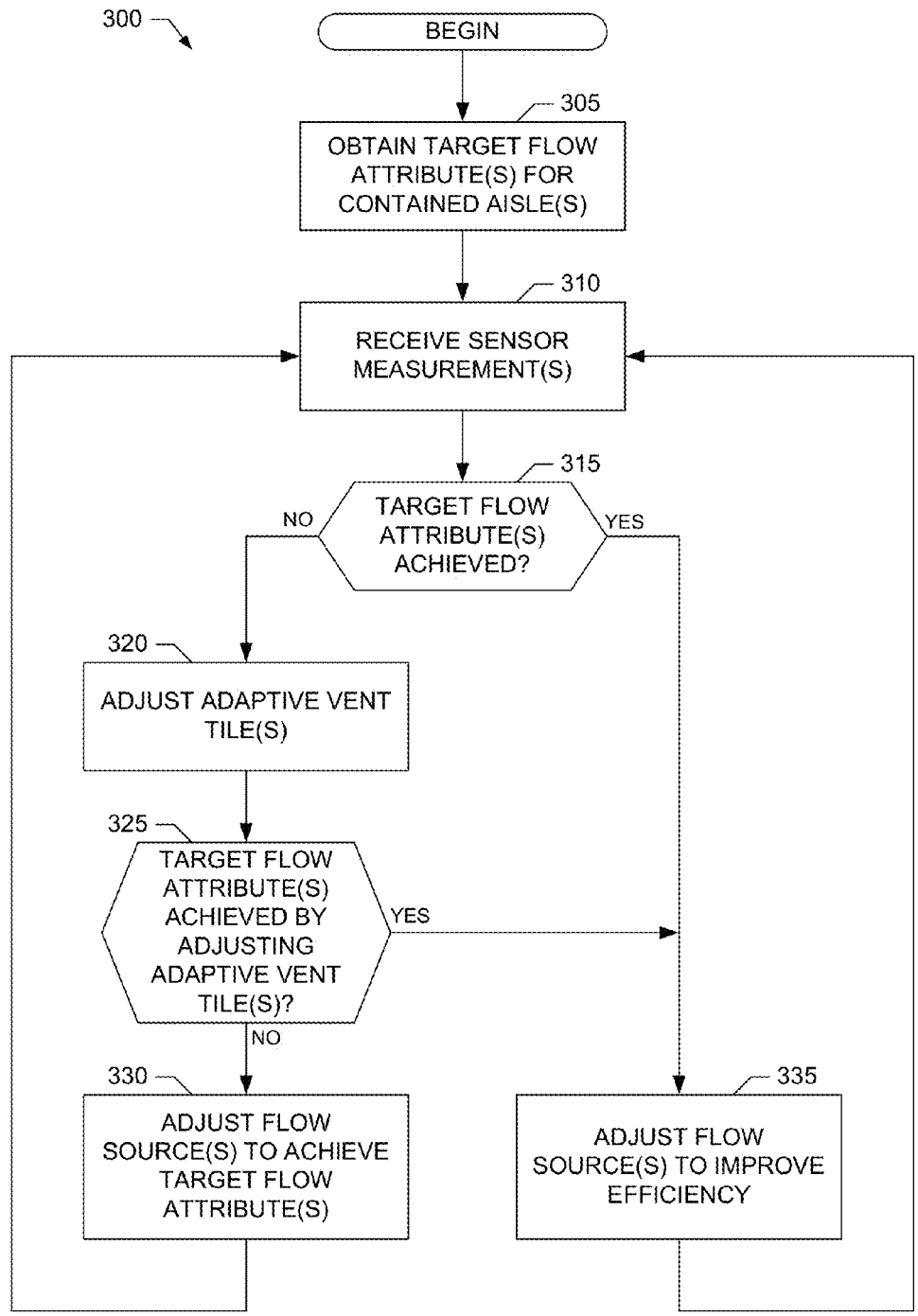
FIG. 3 is a flowchart representative of example machine readable instructions that may be executed to implement the environmental controller of FIGS. 1 and/or 2.

A flowchart representative of example machine readable instructions that may be executed to implement the example environmental controller 130, the example configuration processor 205, the example data storage 210, the example sensor interface 215, the example vent controller 220, the example flow source controller 225 and/or the example flow processor 230 are shown in FIG. 3. In these examples, the machine readable instructions represented by the flowchart may comprise one or more programs for execution by a processor, such as the processor 412 shown in the example processing system 400 discussed below in connection with FIG. 4. Alternatively, the entire program or programs and/or portions thereof implementing the process represented by the flowchart of FIG. 3 could be executed by a device other than the processor 412 (e.g., such as a controller and/or any other suitable device) and/or embodied in machine readable instructions or dedicated hardware (e.g., implemented by an ASIC, a PLD, an FPLD, discrete logic, etc.). Also, one or more of the machine readable instructions represented by the flowchart of FIG. 3 may be implemented manually. Further, although the example machine readable instructions are described with reference to the flowchart illustrated in FIG. 3, many other techniques for implementing the example methods and apparatus described herein may alternatively be used. For example, with reference to the flowchart illustrated in FIG. 3, the order of execution of the blocks may be changed, and/or some of the blocks described may be changed, eliminated, combined and/or subdivided into multiple blocks.

As mentioned above, the example process of FIG. 3 may be implemented using coded instructions (e.g., computer readable instructions) stored on a tangible computer readable medium such as a hard disk drive, a flash memory, a read-only memory (ROM), a CD, a DVD, a cache, a random-access memory (RAM) and/or any other storage media in which information is stored for any duration (e.g., for extended time periods, permanently, brief instances, for temporarily buffering, and/or for caching of the information). As used herein, the term tangible computer readable medium is expressly defined to include any type of computer readable storage and to exclude propagating signals. Additionally or alternatively, the example process of FIG. 3 may be implemented using coded instructions (e.g., computer readable instructions) stored on a non-transitory computer readable medium, such as a flash memory, a ROM, a CD, a DVD, a cache, a random-access memory (RAM) and/or any other storage media in which information is stored for any duration (e.g., for extended time periods, permanently, brief instances, for temporarily buffering, and/or for caching of the information). As used herein, the term non-transitory computer readable medium is expressly defined to include any type of computer readable medium and to exclude propagating signals. Also, as used herein, the terms "computer readable" and "machine readable" are considered equivalent unless indicated otherwise.

Example machine readable instructions 300 that may be executed to implement the environmental controller 130 of FIGS. 1-2 are represented by the flowchart shown in FIG. 3. The example machine readable instructions 300 may be executed at intervals (e.g., based on a sensor polling interval, a process control update interval, a clock or timer, etc.), based on an occurrence of an event (e.g., when new sensor measurements are received from one or more of the sensors 140A-G), etc., or any combination thereof. With reference to the preceding figures, the machine readable instructions 300 begin execution at block 305 of FIG. 3 at which the configuration processor 205 included in the environmental controller 130 obtains one or more target environmental conditions for the cold contained aisle(s) 105A-C of the data center 100 and stores the target environmental condition(s) in the data storage 210, as described above. At block 310, the sensor interface 215 included in the environmental controller 130 receives measurements from the sensors 140A-G and stores the sensor measurements in the data storage 210, as described above.

Next, at block 315 flow processor 230 included in the environmental controller 130 compares the sensor measurement(s) with the target environmental condition(s). If the target environmental condition(s) have not been achieved (block 315), at block 320 the flow processor 230 determines appropriate adjustment(s) of the adaptive vent tile(s) 135A-G that is(are) likely to achieve the target environmental condition(s), as described above. At block 320, the flow processor 230 also invokes the vent controller 220 included in the environmental controller 130 to remotely control the adaptive vent tile(s) 135A-G, as described above, to effect the adjustment(s) determined by the flow processor 230 at block 320.

Next, at block 325 the flow processor 230 compares new sensor measurement(s) with the target environmental condition(s) to determine whether the control of the adaptive vent tile(s) 135A-G performed at block 320 achieved the target environmental condition(s). If the target environmental condition(s) have not been achieved (block 325), then at block 330 the flow processor 230 determines appropriate adjustment(s) of one or more of the flow sources 145 to achieve the target environmental condition(s), as described above. At block 330, the flow processor 230 also invokes the flow source controller 225 included in the environmental controller 130 to remotely control the flow source(s) 145, as described above, to effect the adjustment(s) determined by the flow processor 230 at block 330. Processing then returns to block 310 to perform another iteration of the flow control process.

However, if the target environmental condition(s) have been achieved (blocks 315 or 325), then at block 335 the flow processor 230 determines appropriate adjustment(s), if any, of one or more of the flow sources 145 to improve operating efficiency of the flow source(s) 145, as described above. At block 335, the flow processor 230 also invokes the flow source controller 225 to remotely control the flow source(s) 145, as described above, to effect the adjustment(s), if any, determined by the flow processor 230 at block 335. Processing then returns to block 310 to perform another iteration of the flow control process.

Figure 4:
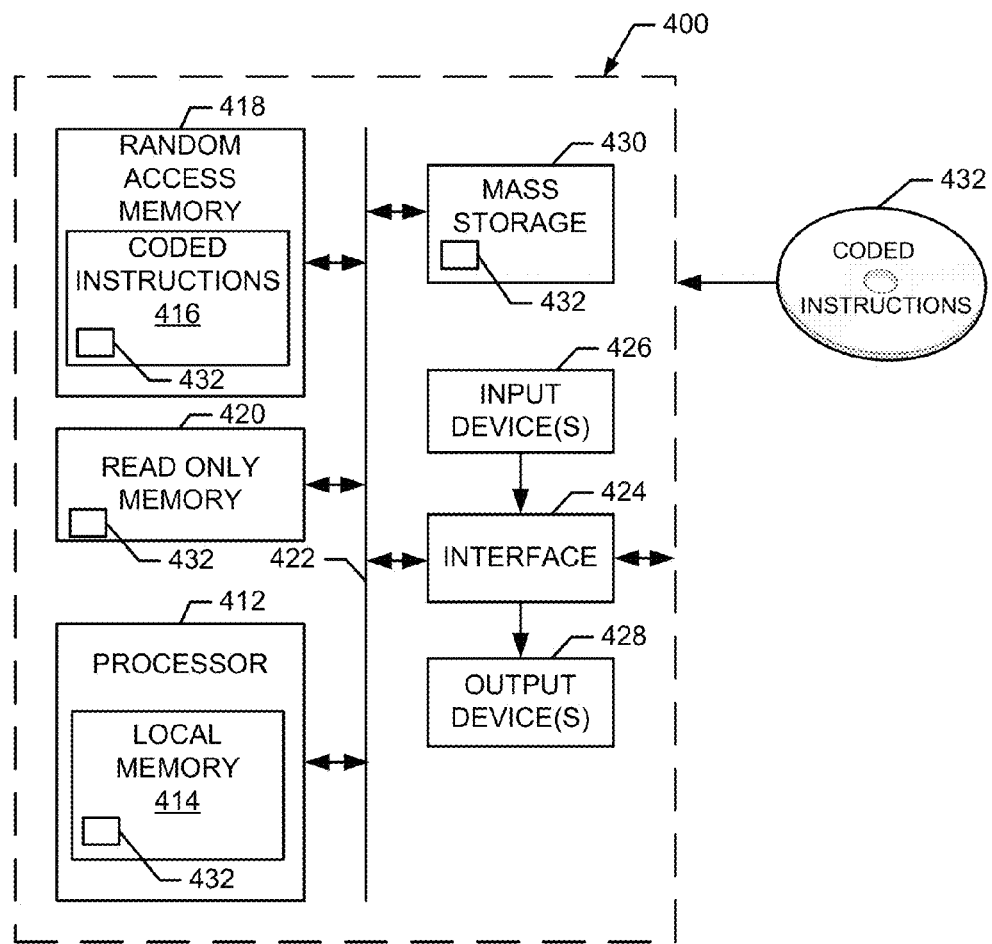
FIG. 4 is a block diagram of an example processing system that may execute the example machine readable instructions of FIG. 3 to implement the environmental controller of FIG. 2 and/or to control flow in the contained aisles of the data center of FIG. 1.

FIG. 4 is a block diagram of an example processing system 400 capable of implementing the example apparatus, systems and methods disclosed herein. The processing system 400 can be, for example, a server, a personal computer, a personal digital assistant (PDA), an Internet appliance, or any other type of computing device.

The system 400 of the instant example includes a processor 412 such as a general purpose programmable processor. The processor 412 includes a local memory 414, and executes coded instructions 416 present in the local memory 414 and/or in another memory device. The processor 412 may execute, among other things, the machine readable instructions represented in FIG. 3. The processor 412 may be any type of processing unit, such as one or more Intel® microprocessors from the Pentium® family, the Itanium® family and/or the XScale® family, one or more microcontrollers from the ARM® and/or PIC® families of microcontrollers, etc. Of course, other processors from other families are also appropriate.

The processor 412 is in communication with a main memory including a volatile memory 418 and a non-volatile memory 420 via a bus 422. The volatile memory 418 may be implemented by Static Random Access Memory (SRAM), Synchronous Dynamic Random Access Memory (SDRAM), Dynamic Random Access Memory (DRAM), RAMBUS Dynamic Random Access Memory (RDRAM) and/or any other type of random access memory device. The non-volatile memory 420 may be implemented by flash memory and/or any other desired type of memory device. Access to the main memory 418, 420 is typically controlled by a memory controller (not shown).

The processing system 400 also includes an interface circuit 424. The interface circuit 424 may be implemented by any type of interface standard, such as an Ethernet interface, a universal serial bus (USB), and/or a third generation input/output (3GIO) interface.

One or more input devices 426 are connected to the interface circuit 424. The input device(s) 426 permit a user to enter data and commands into the processor 412. The input device(s) can be implemented by, for example, a keyboard, a mouse, a touchscreen, a track-pad, a trackball, an isopoint and/or a voice recognition system. In some examples, the input device(s) 426 can be used to input the target environmental condition(s) into the configuration processor 205.

One or more output devices 428 are also connected to the interface circuit 424. The output devices 428 can be implemented, for example, by display devices (e.g., a liquid crystal display, a cathode ray tube display (CRT)), by a printer and/or by speakers. The interface circuit 424, thus, typically includes a graphics driver card.

The interface circuit 424 also includes a communication device such as a modem or network interface card to facilitate exchange of data with external computers via a network (e.g., an Ethernet connection, a digital subscriber line (DSL), a telephone line, coaxial cable, a cellular telephone system, etc.).

The processing system 400 also includes one or more mass storage devices 430 for storing machine readable instructions and data. Examples of such mass storage devices 430 include floppy disk drives, hard drive disks, compact disk drives and digital versatile disk (DVD) drives. In some examples, the mass storage device 430 may implement the data storage 210. Additionally or alternatively, in some examples the volatile memory 418 may implement the data storage 210.

The coded instructions 432 of FIG. 3 may be stored in the mass storage device 430, in the volatile memory 418, in the non-volatile memory 420, in the local memory 414 and/or on a removable storage medium, such as a CD or DVD.

As an alternative to implementing the methods and/or apparatus described herein in a system such as the processing system of FIG. 4, the methods and or apparatus described herein may be embedded in a structure such as a processor and/or an ASIC (application specific integrated circuit).

Example methods, apparatus, systems and articles of manufacture to control fluid flow in a data center have been disclosed. Although example methods, apparatus, systems and articles of manufacture have been described herein in the context of the controlling flow in and between the contained aisles 105A-C and 110A-B of the data center 100 of FIG. 1, these example methods, apparatus, systems and articles of manufacture are not limited thereto. Instead, the example methods, apparatus, systems and articles of manufacture described herein could be used in environments other than the contained aisles 105A-C and 110A-B of the data center 100 of FIG. 1. For example, the methods, apparatus, systems and articles of manufacture described herein can be used in any type of enclosed structure in which the adaptive vent tiles described herein can be used to alter the fluid flow between interior sections of the structure (e.g., by replacing windows with adaptive vent tiles, inserting adaptive vent tiles in walls, etc.), and/or alter the fluid flow between the interior of the structure and the exterior of the structure (e.g., by inserting adaptive vent tiles in the exhaust stream of the structure's HVAC system). As such, the methods, apparatus, systems and articles of manufacture described herein can be used in many industrial, commercial and residential ecosystems, in addition to being used in the data center 100 of FIG. 1.

Finally, although certain example methods, apparatus, systems and articles of manufacture have been described herein, the scope of coverage of this patent is not limited thereto. On the contrary, this patent covers all methods, apparatus, systems and articles of manufacture fairly falling within the scope of the claims either literally or under the doctrine of equivalents.

What is claimed is:

1. A method to control fluid flow in a data center, the method comprising:
   obtaining a sensed pressure of a fluid in a first contained aisle on a first side of data center equipment, the fluid in the first contained aisle to be exhausted by the data center equipment into a second contained aisle on a second side of the data center equipment;
   controlling an actuator of a vent to cause the vent to adjust a first fluid flow in a direction from the second contained aisle to the first contained aisle based on the sensed pressure; and
   responsive to determining that a target fluid pressure for the first contained aisle has been met by (1) controlling the actuator of the vent to increase the first fluid flow in the direction from the second contained aisle to the first contained aisle, but (2) without controlling operation of a flow source providing the fluid to the first contained aisle, subsequently adjusting an operation of the flow source to improve flow source operating efficiency.

2. A method as defined in claim 1 wherein the sensed pressure is sensed at the first side of the data center equipment, and controlling the actuator of the vent comprises:
   automatically controlling the actuator of the vent to cause the vent to increase the first fluid flow in the direction from the second contained aisle to the first contained aisle when the sensed pressure is below the target fluid pressure; and
   automatically controlling the actuator of the vent to cause the vent to decrease the first fluid flow in the direction from the second contained aisle to the first contained aisle when the sensed pressure is above the target fluid pressure.

3. A method as defined in claim 1 further comprising controlling the operation of the flow source based on the sensed pressure.

4. A method as defined in claim 3 wherein the sensed pressure is sensed at the first side of the data center equipment, and further comprising:
   sensing a temperature of the fluid in the first contained aisle;
   when the sensed pressure is below the target fluid pressure and the sensed temperature is below a target temperature, automatically controlling the actuator of the vent to cause the vent to increase the first fluid flow from the second contained aisle to the first contained aisle; and
   when the sensed pressure is below the target fluid pressure and the sensed temperature is above the target temperature, adjusting the operation of the flow source to increase the sensed pressure.

5. A method as defined in claim 1 wherein adjusting the operation of the flow source to improve the flow source operating efficiency comprises at least one of:
   decreasing a flow rate of an output flow of the flow source;
   decreasing a pressure of the output flow of the flow source; or
   increasing a temperature of the output flow of the flow source.

6. A method as defined in claim 1 further comprising:
   if the target fluid pressure has not been achieved, adjusting the operation of the flow source to achieve the target fluid pressure.

7. A method as defined in claim 6 wherein adjusting the operation of the flow source to achieve the target fluid pressure comprises at least one of:
   increasing a flow rate of an output flow of the flow source;
   increasing a pressure of the output flow of the flow source; or
   decreasing a temperature of the output flow of the flow source.

8. A method as defined in claim 1 wherein the actuator is to adjust an opening of the vent without adjusting the operation of the flow source providing the fluid to the first contained aisle.

9. An apparatus for a data center comprising:
   a sensor interface to receive measurements from sensors positioned to obtain sensed fluid pressures in first and second contained aisles in the data center, the first and second contained aisles being separated by a third contained aisle, the first and second contained aisles containing cooling fluid to be exhausted by data center equipment into the third contained aisle; and
   a controller to:
      control actuators of vents positioned to adjust an amount of fluid flow from the third contained aisle to the first contained aisle and from the third contained aisle to the second contained aisle to cause the vents to adjust the amount of fluid flow in a direction from the third contained aisle to the first contained aisle and in a direction from the third contained aisle to the second contained aisle based on the measurements received from the sensors, and target fluid pressures for the first and second contained aisles; and
      responsive to a making a determination that the target fluid pressures for the first and second contained aisles have been met by (1) controlling the actuators of the vents to increase the amount of fluid flow in the direction from the third contained aisle to the first contained aisle and in the direction from the third contained aisle to the second contained aisle, but (2)

without controlling operation of a cooling source providing the cooling fluid to the first and second contained aisles, subsequently adjust an operation of the cooling source to improve cooling source operating efficiency.

10. An apparatus as defined in claim 9 wherein the vents comprise first and second vents, the controller is to independently control the first vent and the second vent, the first vent is to adjust a first fluid flow from the third contained aisle to the first contained aisle, and the second vent is to adjust a second fluid flow from at least one of the third contained aisle or a fourth contained aisle to the second contained aisle.

11. An apparatus as defined in claim 9 wherein the controller is to adjust the operation of the cooling source to meet the target fluid pressures when the target fluid pressures are not met by controlling the vents without controlling the cooling source.

12. An apparatus as defined in claim 9 further comprising a processor to:
repeatedly process the measurements received from the sensors to determine whether the target fluid pressures have been achieved.

13. An apparatus as defined in claim 9 wherein the actuators are to adjust openings of the vents without adjusting the operation of the cooling source providing the cooling fluid to the first and second contained aisles.

14. For use in a data center having a vent positioned to allow fluid flow between a first contained aisle and a second contained aisle in the data center, a tangible computer readable medium comprising machine readable instructions which, when executed, cause a machine to at least:
measure a pressure and a temperature associated with an intake side of data center equipment in communication with the first contained aisle, an exhaust side of the data center equipment being in communication with the second contained aisle;
in response to the pressure as measured being determined to be below a target fluid pressure for the first contained aisle and the temperature as measured being determined to be below a target temperature, but not when the temperature as measured is determined to be above the target temperature, control an actuator of the vent to cause the vent to increase an amount of the fluid flow in a direction from the second contained aisle to the first contained aisle to increase the pressure; and
responsive to making a determination that the target fluid pressure for the first contained aisle has been met by (1) controlling the actuator of the vent to increase the amount of the fluid flow in the direction from the second contained aisle to the first contained aisle, but (2) without controlling operation of a cooling source providing cooling fluid to the first contained aisle, subsequently adjust an operation of the cooling source to improve cooling source operating efficiency.

15. A tangible computer readable medium as defined in claim 14 wherein the machine readable instructions, when executed, further cause the machine to:
adjust the operation of the cooling source to meet the target fluid pressure if the target fluid pressure has not been met after controlling the actuator of the vent without controlling the cooling source.

16. A tangible computer readable medium as defined in claim 14 wherein the machine readable instructions, when executed, cause the machine to at least one of decrease a flow rate of an output flow of the cooling source, decrease a pressure of the output flow of the cooling source, or increase a temperature of the output flow of the cooling source to improve the cooling source operating efficiency.

17. A tangible computer readable medium as defined in claim 14 wherein the actuator is to adjust an opening of the vent without adjusting the operation of the cooling source providing the cooling fluid to the first contained aisle.

* * * * *